United States Patent [19]

Jackson

[11] 4,372,789

[45] Feb. 8, 1983

[54] DIRECTIONALLY STRENGTHENED COPPER ALLOY PARTS FOR A GAS TURBINE

[75] Inventor: Joseph J. Jackson, Westchester, Ohio

[73] Assignee: General Electric Company, Schenectady, N.Y.

[21] Appl. No.: 176,191

[22] Filed: Aug. 7, 1980

[51] Int. Cl.$^3$ .............................................. C22F 1/08
[52] U.S. Cl. .................................... 148/3; 75/159; 75/164; 148/32.5; 148/160
[58] Field of Search .................... 148/32, 32.5, 160, 3; 75/159, 164

[56] References Cited

U.S. PATENT DOCUMENTS

| | | | |
|---|---|---|---|
| 3,260,505 | 7/1966 | Ver Snyder | 75/171 X |
| 3,494,709 | 2/1970 | Piearcey | 75/171 X |
| 3,677,835 | 7/1972 | Tien et al. | 148/32.5 |

*Primary Examiner*—Peter K. Skiff
*Attorney, Agent, or Firm*—Ormand R. Austin; John F. Ahern

[57] ABSTRACT

A gas turbine, copper-based alloy part having a crystalline structure in which grain boundaries are elongated in the direction of principal stress applied to the part when in turbine service exhibits especially enhanced strength and fatigue resistance in such direction. The part is prepared in a process in which it is first cast to shape in a mold and then directionally solidified by substantially limiting the heat flow from the part to a direction parallel to the principal stress direction.

10 Claims, 3 Drawing Figures

DIRECTIONALLY STRENGTHENED COPPER ALLOY PARTS FOR A GAS TURBINE

This invention relates to the manufacture of gas turbine component parts having superior high temperature stress-rupture and thermal and mechanical fatigue properties, and more particularly to gas or water-cooled copper-based alloy parts for a gas turbine which parts are directionally strengthened parallel to the direction of principal stress imposed thereon when such parts are in turbine service.

BACKGROUND OF THE INVENTION

Because of their outstanding thermal conductivity, precipitation hardened and dispersion strengthened copper-based alloys are currently of interest for use in gas and water-cooled composite-metal parts for high temperature gas turbines. These composite-metal parts, including water-cooled buckets and nozzles for example, preferably comprise a copper alloy core having a second, more corrosion resistant metal cladding metallurgically bonded to the exposed, outer surface. The cladding permits the use of copper alloys at metal temperatures previously too high for copper-based materials, i.e., 600° F. and above.

In this temperature range, however, existing high strength wrought copper alloys suffer a drastic reduction in strength due to recovery, recrystallization, and grain growth and they have not, therefore, provided the long term reliability necessary for gas turbine service. Although other, more stable copper alloys, such as the oxide dispersion strengthened systems (strengthened for example by $Al_2O_3, MgO, Zr_2O_3$) have good elevated temperature strength and stability they are difficult to produce and they exhibit marginally low stress-rupture ductility. In addition, other solid solution strengthened copper alloys such as Cu-Zn, Cu-Ni and Cu-Sn do not exhibit the high level of thermal conductivity necessary for effective water-cooling.

It is known in the art to strengthen nickel-based alloys for gas turbine service by a process of directional solidification. For example U.S. Pat. No. 3,260,505 discloses a turbine blade of nickel alloy which is strengthened in this manner. U.S. Pat. No. 3,494,709 further discloses alloy metal parts strengthened by this process for gas turbine service. However, it is notable that nickel and alloys thereof have relatively poor thermal conductivity, i.e., on the order of one-tenth or less the value for pure copper and precipitation hardened copper-based alloys. For this reason, alloys of nickel are not effective for gas or water-cooled turbine parts wherein the heat transferred from the high temperature turbine gas must be quickly and efficiently transferred to the cooling gas or water. Copper alloys are recognized as being the most effective and economical metals from a heat transfer standpoint.

It is, therefore, one object of the present invention to provide copper-based alloy articles having improved stress-rupture properties at elevated temperatures which can be manufactured without substantial sacrifice in alloy thermal conductivity.

Furthermore, recognizing that component parts of gas turbines are subject to operating stresses whose magnitudes are greater in some directions than in others, it is a principal object of the invention to provide copper-based alloy components for gas turbines which have enhanced high temperature fatigue resistance and strength and which are directionally strengthened parallel to the direction of primary stress imposed during turbine operation.

SUMMARY OF THE INVENTION

A gas turbine, copper-based alloy part according to the invention is produced in a directional solidification process in which the part is first cast to the desired shape in a mold and then directionally solidified by substantially limiting the heat flow from the part to a direction parallel to the direction of principal stress which the part will receive when in turbine service. The resulting part is characterized by having a crystalline structure in which the grain boundaries are elongated in the heat flow or solidification direction, but which are of very limited extent transverse thereto.

The turbine part may be an entire turbine bucket or nozzle, an airfoil section or segment, or any other integral copper-based alloy part of a gas or water-cooled gas turbine component. In accordance with the invention, the part will have especially enhanced strength and fatigue resistance in the direction of primary stress.

Preferably, the copper alloy used in the process is a precipitation hardened copper-based alloy containing either about 5 percent nickel and 2.5 percent titanium, or about 2.5 percent cobalt.

BRIEF DESCRIPTION OF THE DRAWINGS

While the specification concludes with claims particularly pointing out and distinctly claiming the subject matter regarded as the invention, the invention will be better understood from the following description taken in connection with the accompanying drawings in which:

DETAILED DESCRIPTION OF THE INVENTION

Figure 1:
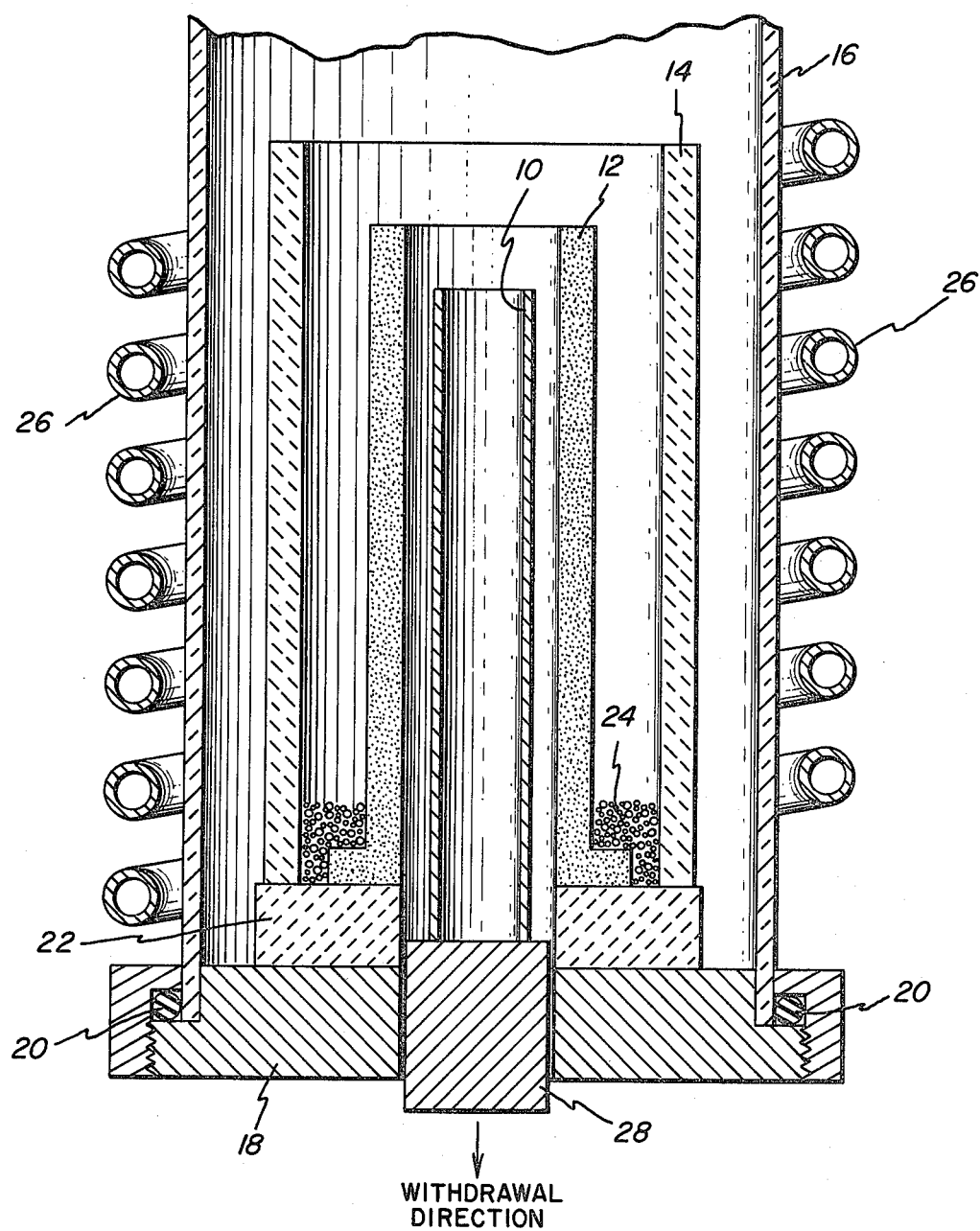
FIG. 1 is a schematic cross-sectional illustration of one form of apparatus for carrying out a process to make copper-based alloy articles according to the invention.

The present invention may be advantageously explained in connection with FIG. 1 which schematically illustrates induction heating apparatus adapted for a directional solidification process by which copper-based alloy parts according to the present invention may be produced. With the apparatus of FIG. 1, copper alloy is charged to an alumina crucible 10 which is concentric with a graphite susceptor 12, a ceramic sleeve 14, and a quartz bell jar 16. The quartz bell jar 16 is sealed to a water-cooled base-plate 18 by an O-ring seal 20 to allow internal purging with an inert gas such as argon as the process is being carried out. The graphite susceptor 12 rests on a ceramic insulator base 22 which in turn is supported by water-cooled base 18. The annular space between susceptor 12 and ceramic sleeve 14 is filled with a loose, high temperature insulating material such as alumina bubbles 24. An induction heating coil 26 surrounds the quartz bell jar and is substantially concentric with graphite susceptor 12. The induction coil 26 is connected to an induction heating generator (not shown in the Figure) and is powered thereby to cause induction heating of the graphite susceptor 12.

In operation, the copper alloy contained in the crucible 10 is melted at about 1250° C. by heat transferred from susceptor 12. The molten copper alloy rests on a water-cooled copper chill plate 28 towards which heat from the molten metal flows in a substantially unidirectional manner. The bell jar assembly and those pieces of apparatus internally concentric thereto are then slowly withdrawn from within the induction heating coil 26. This procedure produces solidification of the molten alloy starting at the chill plate 28 and propagating upwards as withdrawal proceeds. The result is a solid article formed of the copper alloy and which is characterized by an elongated crystalline grain structure oriented substantially parallel to the withdrawal direction but having limited, or no substantial grain boundaries transverse to the withdrawal direction. The processed article is further characterized by having low casting porosity and enhanced strength, particularly longitudinally, parallel to the withdrawal direction.

It will be recognized, of course, that alumina crucible 10 is essentially a mold for a cylindrical bar shape. It will be further appreciated, therefore, that the crucible 10 may be replaced by a mold form taking virtually any desired shape and that corresponding changes may be made in the geometry of the other components of the apparatus to accommodate such other shapes. For example, a mold shaped to the form of a gas turbine bucket or blade can be rather easily accommodated in the apparatus of FIG. 1 without extensive modifications thereto. In some instances, induction heating may be advantageously replaced by other heating means for practice of the process.

For producing a gas turbine copper alloy bucket or blade, for example, the longitudinal axis of the bucket is oriented vertically in the same manner as for a bar or rod. Upon solidification, heat flow is unidirectional along the longitudinal axis of the bucket and is therefore parallel to the principal stress axis of the bucket. The directional solidification process produces a grain structure unique for copper alloy buckets and, as described above, is characterized by having elongated grain boundaries parallel to the longitudinal axis of the bucket but with no substantial grain boundaries in the transverse direction. The copper alloy blade is greatly strengthened in the longitudinal direction and is rendered much more ductile by the process.

Working Examples

Specific examples and test results will now be given to further describe and illustrate the invention.

Figure 2:
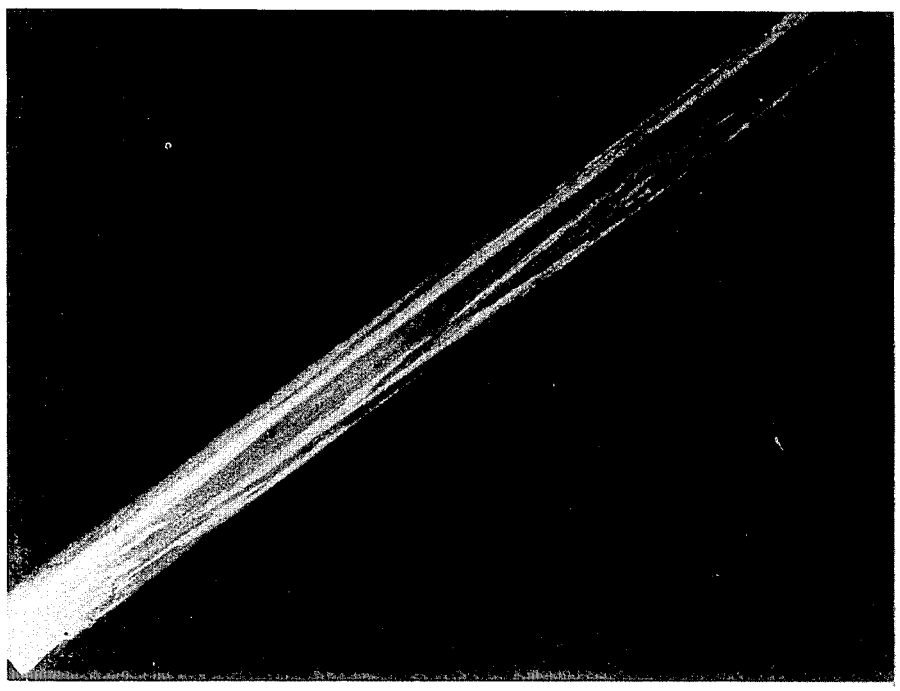
FIG. 2 is a photomicrograph at 1.2× magnification of a bar of Cu-5Ni-2.5Ti alloy prepared according to the invention and illustrating the resulting preferential alignment of grain structure parallel to the longitudinal axis of the bar.
Figure 3:
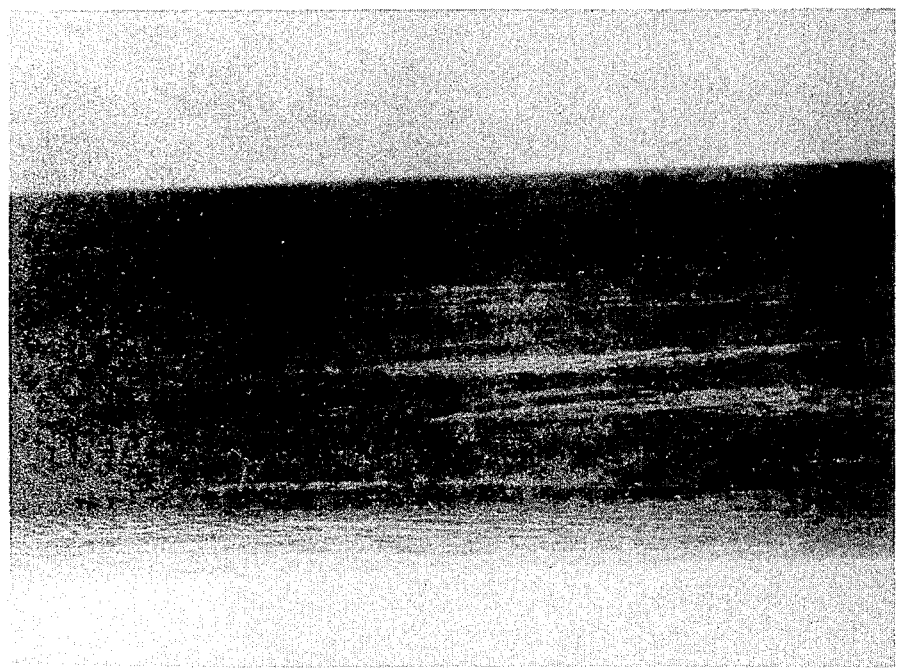
FIG. 3 is a photomicrograph of the bar of FIG. 2 at 4× magnification further illustrating the aligned grain structure.

With the apparatus of FIG. 1, copper alloy cylindrical bars of 0.625 and 0.850 inches in diameter were produced using as a starting material commercially available precipitation hardened copper alloys. These alloys were of two compositions: (1) 5 percent nickel, 2.5 percent titanium, and the balance copper; and (2) 2.5 percent cobalt and a copper balance. The bars were processed in an argon atmosphere and withdrawn from the heating zone at a rate of 20 inches per hour. Grain structure of typical bars thus obtained is shown in the photomicrographs of FIGS. 1 and 2 in which the grain boundaries are clearly oriented substantially parallel to the longitudinal axis of the bar.

The following table presents test results on the above described copper alloy cylindrical bars prepared according to the invention as compared with results obtained from testing commercially available strengthened alloy bars. The first three tabular entries (1, 2 & 3) are for commercial alloys, those after that, (4 & 5) generally designated as DS, are for specimens prepared by the process as described above.

| ALLOY | SPECIMEN NUMBER | TREATMENT[2] | TEST CONDITIONS | RUPTURE LIFE HOURS | RUPTURE ELONGATION |
|---|---|---|---|---|---|
| 1. Glidcop A160 | G15S3 | C | 800° F./20ksi | 103.7 | 2.8% |
| (Cu—6 v/o $Al_2O_3$) | GS5 | B | 1000° F./20ksi | 1.1 | 2.0% |
|  | G15S5 | C | 1000° F./20ksi | 1.2 | 3.6% |
| 2. Wrought | E24S1 | D | 800° F./20ksi | 25.2 | 7.3% |
| Cu—5Ni—2.5Ti | E24S2 | D | 800° F./20ksi | 77.1 | 3.2% |
| 3. Wrought | F25S2 | F | 800° F./20ksi | 134.1 | 3.2% |
| Cu—2.5Co—.6Be | F25S4 | F | 800° F./25ksi | 46.3 | 3.4% |
| 4. DS | 59E26S1[1] | E | 800° F./20ksi | 338.0+ | Temperature Increased |
| Cu—5Ni—2.5Ti | 59W26S1[1] | E | 1000° F./20ksi | 97.1 | 34.0% |
|  | 60DS1[1] | A | 800° F./20ksi | 338.8+ | Temperature Increased |
|  | 60DS1[1] | A | 1000° F./20ksi | 76.6 | 40.4% |
|  | 60DS3 | A | 800° F./30ksi | 130.2 | 53.0% |
| 5. DS CU—2.5Co | 67C37S1[1] | G | 800° F./15ksi | 262.7+ | Temperature Increased |
|  | 67C37S1[1] | G | 1000° F./15ksi | 297.8 | 56.2% |
|  | 67(H)B37S1[1] | G | 800° F./20ksi | 549.5+ | Temperature Increased |
|  | 67(H)B37S1[1] | G | 1000° F./20ksi | 0.6 | 14.2% |

[1]These specimens were tested at the initial condition for the times indicated with no extension detected and then the temperature increased as shown.
[2]Heat treatments prior to test:
A: As-Cast
B: As-extruded at 1382° F./14:1
C: 1750° F.(2 Hrs.)AC + 1325° F.(8 Hrs.)FC→1150° F.(10 Hrs.)AC
D: 1750° F.(2 Hrs.)AC + 930° F.(6 Hrs.)AC
E: 1950° F.(1 Hr.)AC + 850° F.(16 Hrs.)AC + 930° F.(4 Hrs.)AC
F: 1750° F.(2 Hrs.)AC + 900° F.(2 Hrs.)AC
G: 1750° F.(2 Hrs.)AC + 1100° F.(2 Hrs.)AC
AC = air cooled
FC = furnace cooled Clearly evident from the above table is the improvement in rupture strength and ductility gained over presently available wrought copper alloys and dispersion strengthened copper alloys.

Thus, while the foregoing has provided a description of certain forms of the invention and of the best mode contemplated for its practice, other embodiments and modifications which will be recognized by those skilled in the art may be made thereto without departing from the scope of the invention. It is intended by the appended claims to claim all modifications and embodiments which fall within the true spirit and scope of the invention.

What is claimed is:

1. A directionally strengthened part for a gas turbine, which part is composed of a precipitation strengthened copper-based alloy having high thermal conductivity and a crystalline grain structure characterized by elongated grain boundaries parallel to the direction of principal stress applied to such part when in turbine service and by substantially no grain boundaries transverse thereto.

2. A gas turbine part according to claim 1 wherein said precipitation strengthened copper-based alloy has a composition of about 5 percent nickel, about 2.5 percent titanium, and the balance is copper.

3. A gas turbine part according to claim 1 wherein said precipitation strengthened copper-based alloy has a composition of about 2.5 percent cobalt and the balance is copper.

4. A gas turbine part according to claims 1, 2, or 3 wherein such part is adapted to be air or water-cooled.

5. A directionally strengthened gas turbine part having high thermal conductivity, said part produced from the process comprising the steps of:

(a) casting copper-based alloy metal in a mold to the shape of said part; and (b) directionally solidifying said part within said mold by substantially controlling the direction of heat flow from said part to be parallel to the direction of primary stress imposed on said part when in use in a gas turbine.

6. A gas turbine part produced according to the process of claim 5 wherein said process further includes the step of controlling the rate of directional solidification by controlling the rate of said parallel heat flow.

7. A gas turbine part produced according to the process of claim 5 wherein said copper alloy metal is precipitation strengthened prior to its use in such process.

8. A gas turbine part produced according to the process of claim 5 wherein said copper-based alloy contains about 5 weight percent nickel, and about 2.5 weight percent titanium.

9. A gas turbine part produced according to the process of claim 5 wherein said copper-based alloy contains about 2.5 weight percent cobalt.

10. A gas turbine part produced according to the process of claim 5 wherein heat flow direction from said part and solidification rate are controlled by controllably removing said part while in said mold from within a heating zone.

* * * * *